(12) United States Patent
Ahn et al.

(10) Patent No.: US 9,970,616 B2
(45) Date of Patent: May 15, 2018

(54) LIGHTING APPARATUS FOR VEHICLE

(71) Applicant: Hyundai Motor Company, Seoul (KR)

(72) Inventors: Byoung Suk Ahn, Suwon-si (KR); Jik Soo Shin, Incheon (KR); Keon Soo Jin, Ulsan (KR); Jin Ho Na, Yongin-si (KR); Ki Hong Lee, Seoul (KR)

(73) Assignee: Hyundai Motor Company, Seoul (KR)

( * ) Notice: Subject to any disclaimer, the term of this patent is extended or adjusted under 35 U.S.C. 154(b) by 15 days.

(21) Appl. No.: 15/203,477

(22) Filed: Jul. 6, 2016

(65) Prior Publication Data

US 2017/0254495 A1    Sep. 7, 2017

(30) Foreign Application Priority Data

Mar. 7, 2016 (KR) .................... 10-2016-0027048

(51) Int. Cl.
| | |
|---|---|
| *F21V 9/14* | (2006.01) |
| *F21S 8/10* | (2006.01) |
| *F21V 9/16* | (2006.01) |
| *F21Y 115/30* | (2016.01) |

(52) U.S. Cl.
CPC ......... *F21S 48/114* (2013.01); *F21S 48/1225* (2013.01); *F21S 48/1317* (2013.01); *F21V 9/14* (2013.01); *F21V 9/16* (2013.01); *F21Y 2115/30* (2016.08)

(58) Field of Classification Search
CPC ........ F21V 9/14; F21S 48/114; F21S 48/1317
USPC ......................................................... 362/19
See application file for complete search history.

(56) References Cited

U.S. PATENT DOCUMENTS

| | | | | |
|---|---|---|---|---|
| 4,746,202 A | * | 5/1988 | Perilloux | G02B 5/0858 219/121.74 |
| 2005/0224826 A1 | * | 10/2005 | Keuper | H01L 33/0004 257/98 |
| 2013/0265561 A1 | * | 10/2013 | Takahira | F21V 7/06 356/3 |
| 2016/0138780 A1 | * | 5/2016 | Oh | F21V 9/14 362/19 |

FOREIGN PATENT DOCUMENTS

| | | |
|---|---|---|
| JP | 2008-506155 A | 2/2008 |
| JP | 2012-069908 A | 4/2012 |
| JP | 2012-195253 A | 10/2012 |
| JP | 2012-212690 A | 11/2012 |
| JP | 2014-157840 A | 8/2014 |
| JP | 2014-174221 A | 9/2014 |
| JP | 2015-038885 A | 2/2015 |
| JP | 2015-504241 A | 2/2015 |
| JP | 2015-115276 A | 6/2015 |
| WO | WO 2013/091453 A1 | 6/2013 |

* cited by examiner

*Primary Examiner* — Toan Ly
(74) *Attorney, Agent, or Firm* — Morgan, Lewis & Bockius LLP

(57) ABSTRACT

A lighting apparatus for a vehicle may include a light source unit comprising at least two light sources emitting polarized beams in different directions, a filter configured to receive the emitted polarized beams, reflect one of the polarized beams, and transmit another of the polarized beams, and an emitter configured to receive the polarized beams from the filter, and emit the received polarized beams as light of a predetermined color.

6 Claims, 3 Drawing Sheets

LIGHTING APPARATUS FOR VEHICLE

CROSS-REFERENCE TO RELATED APPLICATION

The present application claims priority to Korean Patent Application No. 10-2016-0027048, filed Mar. 7, 2016, the entire contents of which is incorporated herein for all purposes by this reference.

BACKGROUND OF THE INVENTION

Field of the Invention

The present invention relates to a lighting apparatus for a vehicle configured to focus light radiated from a plurality of light sources to an emitting part.

Description of Related Art

Generally, headlamps emit light in a travel direction of a vehicle during travel of the vehicle, to illuminate a road in front of the vehicle, and, as such, the headlamps provide visibility to the driver during nighttime driving. As forward visibility is secured during nighttime driving, using a headlamp, the driver may check obstacles or other vehicles on the road and, as such, safe driving may be achieved.

A high brightness light source is necessary to improve long-range illumination performance at night. A conventional lighting apparatus applied to such lamps includes an excitation light source, a fluorescent substance, and a reflective surface. In this case, the number of reflective surfaces is determined in accordance with the number of light sources. In this regard, there may be disadvantage in terms of layout. As a result, the degree of freedom in design may be lowered.

Further, in the case of an optical system including an excitation light source and a fluorescent substance, the number of fluorescent substances is increased in accordance with the number of light sources, thereby increasing manufacturing costs and the size of the optical system.

The information disclosed in this Background of the Invention section is only for enhancement of understanding of the general background of the invention and should not be taken as an acknowledgement or any form of suggestion that this information forms the prior art already known to a person skilled in the art.

BRIEF SUMMARY

Various aspects of the present invention are directed to providing a lighting apparatus for a vehicle configured to irradiate light emitted from a plurality of light sources onto a fluorescent substance, thereby reducing the size of an optical system, increasing the degree of freedom in design, and reducing manufacturing costs.

According to various aspects of the present invention, a lighting apparatus for a vehicle may include a light source unit comprising at least two light sources emitting polarized beams in different directions, a filter configured to receive the emitted polarized beams, reflect one of the polarized beams, and transmit another of the polarized beams, and an emitter configured to receive the polarized beams from the filter, and emit the received polarized beams as light of a predetermined color.

The at least two light sources may include a first light source and a second light source, the first light source may be configured to emit at least one of a longitudinal and a lateral polarized beam, and the second light source may be configured to emit at least one of a lateral and a longitudinal polarized beam having a polarization direction different from a polarization direction of the polarized beam emitted by the first light source.

The first light source may be configured to emit the lateral polarized beam, and the second light source may be configured to emit the longitudinal polarized beam.

The first and second light sources may be disposed to have an angle difference of 90° between each other, and the polarized beams of the first and second light sources may have a phase difference of 90°.

The filter may be spaced apart a predetermined distance from the light source unit, and the filter may include a polarization filter to reflect the lateral polarized beam and transmit the longitudinal polarized beam, and a mirror to reflect the longitudinal polarized beam toward the polarization filter.

In the filter, the polarization filter receiving the polarized beam of the first light source may be disposed over the reflecting mirror receiving the polarized beam of the second light source, and the emitter may be disposed over the polarization filter, so the polarized beams of the first and second light sources are incident upon the emitter through the polarization filter and the reflecting mirror.

The light source unit may further include a condensing lens unit for focusing the polarized beams emitted from the light source unit on a focal point, and the emitter may be disposed at a position corresponding to the focal point, on which the polarized beam emitted from the second light source is focused after being reflected through the reflecting mirror.

The beams emitted by the emitter may illuminate a front and rear of the vehicle through at least one of a reflector and a lens.

The lighting apparatus may further include a housing having an inner space, the light source unit may be disposed at a supporter which is disposed at a first side of the inner space, the filter may be disposed at a second side opposite to the first side and may be disposed in line with and spaced apart from the light source unit, and the emitter may be positioned at an upper end of the housing and disposed over the filter.

It is understood that the term "vehicle" or "vehicular" or other similar terms as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuel derived from resources other than petroleum). As referred to herein, a hybrid vehicle is a vehicle that has two or more sources of power, for example, both gasoline-powered and electric-powered vehicles.

The methods and apparatuses of the present invention have other features and advantages which will be apparent from or are set forth in more detail in the accompanying drawings, which are incorporated herein, and the following Detailed Description, which together serve to explain certain principles of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

Figure 1:
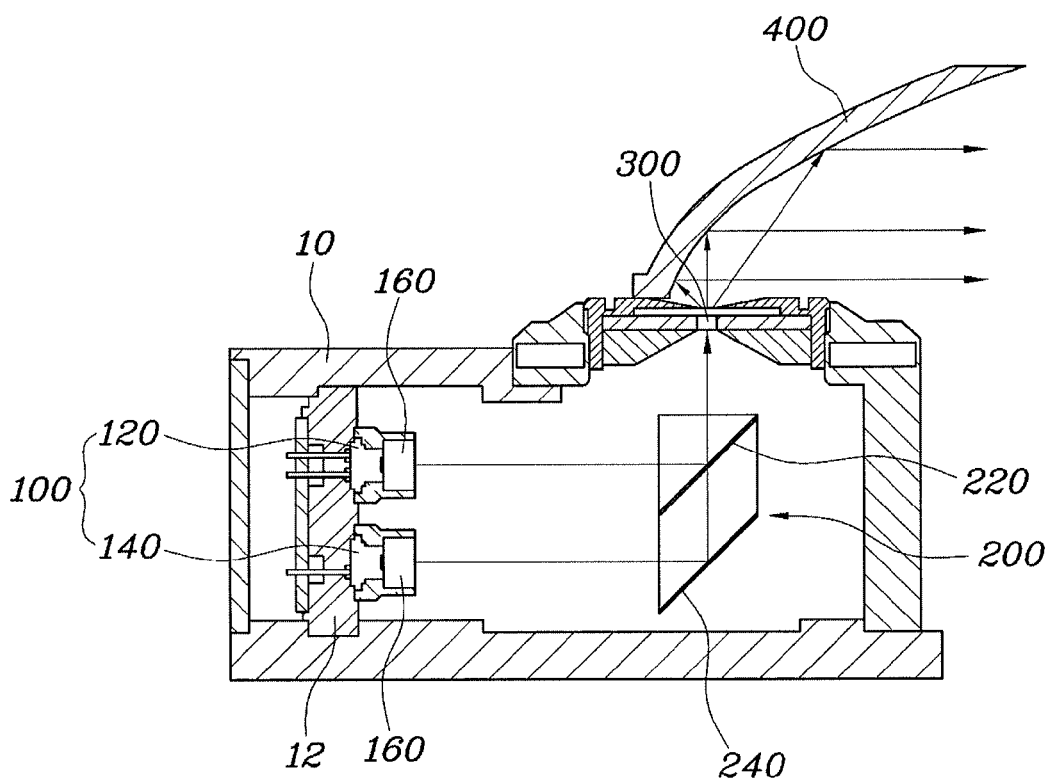
FIG. 1 is a view illustrating a lighting apparatus for a vehicle according to various embodiments of the present invention.
Figure 2:
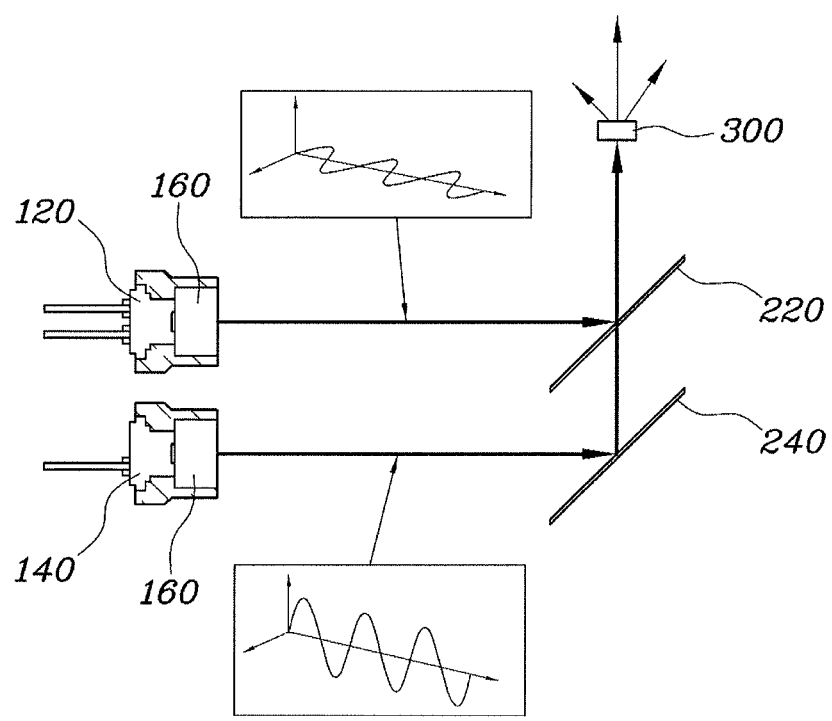
FIG. 2 is a view illustrating the lighting apparatus according to various embodiments of the present invention.
Figure 3:
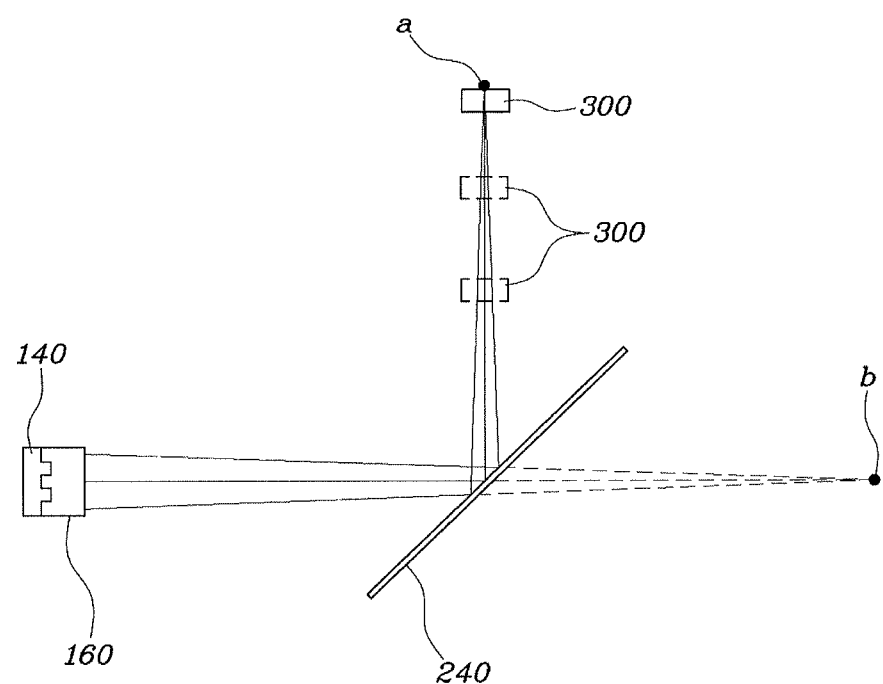
FIG. 3 is a view illustrating the lighting apparatus according to various embodiments of the present invention.

FIG. 1 is a view illustrating a lighting apparatus for a vehicle according to various embodiments of the present invention, and FIGS. 2 and 3 are views illustrating the lighting apparatus according to various embodiments of the present invention.

As shown in FIG. 1, the lighting apparatus for the vehicle according to various embodiments of the present invention includes a light source unit 100 for emitting polarized beams in different directions, respectively, a filter 200 arranged to receive the polarized beams emitted from the light source unit 100 and configured to reflect one group of the received polarized beams while transmitting the other group of the received polarized beams, and an emitter 300 for emitting the received polarized beams as light of a predetermined color.

In various embodiments of the present invention, the light source unit 100 may include a laser diode. In this case, the laser diode may be configured to generate a blue beam. When the laser diode is applied to the light source unit 100, as described above, it may be possible to easily implement use of a plurality of light sources forming the light source unit 100. Particularly, in this case, the plurality of light sources may emit polarized beams in different directions. This is because the laser diode forming the light source unit 100 has a specific polarization and, as such, wavelengths of laser beams may be set to be different from one another through installation of laser diodes at different angles.

When the light source unit 100 includes a plurality of light sources, as described above, the filter 200 may reflect one group of the polarized beams emitted from the light source unit 100, and transmit the other group of the emitted polarized beams. Accordingly, the filter 200 may include a polarization filter 220. In this case, the polarization filter 220 reflects one group of polarized beams emitted from one part of the light source unit 100 and transmits the other group of polarized beams emitted from the other part of the light source unit 100. As such, the polarized beams incident upon the filter 200 may be finally output through one emitter 300. The filter 200 will be described in detail below.

The emitter 300 includes a fluorescent substance which reacts with laser beams emitted from the light source unit 100 to output light of a predetermined color. For example, when the light source unit 100 emits blue laser beams and the emitter 300 includes a fluorescent substance emitting a yellow color, the blue laser beams react with the yellow fluorescent substance, and, as such, a laser beam visually recognizable as white light is emitted.

As described above, according to various embodiments of the present invention, polarized beams emitted from the light source unit 100, which includes a plurality of light sources, are irradiated onto the single emitter 300 via the filter 200. In addition, the single emitter 300 emits the irradiated polarized beams as light. Thus, the entire layout of the lighting apparatus may be reduced.

As illustrated in FIGS. 1 and 2, the light source unit 100 includes a first light source 120 and a second light source 140. The first light source 120 emits polarized beams in a longitudinal direction or a lateral direction. The second light source 140 emits polarized beams in a lateral direction or a longitudinal direction, which is different from the direction of the polarized beams emitted from the first light source 120. Namely, the first and second light sources 120 and 140 emit polarized beams in different directions from each other. When the first light source 120 emits longitudinal polarized beams, the second light source 140 emits lateral polarized beams. On the other hand, when the first light source 120 emits lateral polarized beams, the second light source 140 emits longitudinal polarized beams. An arrangement of a mirror 220 and the polarization filter 240 in the filter 200, which will be described below, may be changed in accordance with the directions of the polarized beams emitted from the first and second light sources 120 and 140.

In various embodiments of the present invention, the first light source 120 emits lateral polarized beams and the second light source 140 emits longitudinal polarized beams. When the first and second light sources 120 and 140 form the light source unit 100, each of the polarized beams of the first and second light sources 120 and 140 may have specific polarization. In other words, the first and second light sources 120 and 140 emit polarized beams in different directions. In addition, the first and second light sources 120 and 140 have identical specifications, while having different installation angles. As such, directions of the polarized beams may be different from each other.

For example, the first light source 120 may emit the lateral polarized beams and the second light source 140 may emit the longitudinal polarized beams. Furthermore, the first and second light sources 120 and 140 may be installed to have an angle difference of 90° between each other. Thus, the polarized beams of the first and second light sources 120 and 140 may have a phase difference of 90° between each other. When the first and second light sources 120 and 140 have a phase difference of 90°, as described above, it is possible to easily design the first and second light sources 120 and 140, which should have different installation angles. Additionally, it is possible to easily configure the polarization filter 220 of the filter 200, such that the polarization filter 220 transmits one group of polarized beams of one direction while reflecting the other group of polarized beams of the other direction. Accordingly, the angle between the directions of the polarized beams emitted from the first and second light sources 120 and 140, to be reflected or transmitted by the polarization filter 220, may be set to various angles rather than 90°.

In various embodiments, the filter 200 is spaced apart a predetermined distance from the light source unit 100. The filter 200 may include the polarization filter 220 and the refection mirror 240. The polarization filter 220 reflects the lateral polarized beams emitted from the first light source 120 and transmits the longitudinal polarized beams emitted from the second light source 140. The mirror 240 reflects the longitudinal polarized beams emitted from the second light source 140 toward the polarization filter 220.

Here, the polarization filter 220 of the filter 200 is configured to classify incident laser beams into a vertically polarized wave and a horizontally polarized wave in order to reflect or transmit the incident laser beams. The polarization filter 220 may include a polyvinyl alcohol (PVA) film (a polarizing element) dyed with a dichroic material, and tri-acetate cellulose (TAC) films bonded to both sides of the polarizing element, to function as a protector. In this case, the polarization filter 220 may have a three layered structure of TAC-PVA-TAC. Here, a surface coating process may be further performed on surfaces of the TAC films to provide required characteristics, for example, scattering, hardness enhancement, and reflection characteristics.

The mirror 240 may change a traveling path of the polarized beams emitted from the second light source 140. A prism may be employed in place of the mirror 240.

In detail, in the filter 200, the polarization filter 220 receiving the polarized beams of the first light source 120 is disposed over the mirror 240 receiving the polarized beams of the second light source 140. Further, the emitter 300 is disposed over the polarization filter 220. Accordingly, the polarized beams of the first and second light sources 120 and 140 emerging from the polarization filter 220 and the mirror 240, may be incident upon the emitter 300.

As shown in FIG. 1, the first light source 120 may be disposed over the second light source 140. In this case, the polarization filter 220 may be disposed in line with and spaced apart from the first light source 120 in a horizontal direction. Furthermore, the mirror 240 may be disposed in line with and spaced apart from the second light source 140 in a horizontal direction while being disposed below the polarization filter 220. Particularly, the polarization filter 220 and the mirror 240 may be tilted at a predetermined angle in order to vertically reflect the polarized beams emitted from the first and second light sources 120 and 140 in an upward direction. In addition, the emitter 300 may be disposed over the polarization filter 220 so that the polarized beams reflected through the polarization filter 220 and the mirror 240 is incident upon the emitter 300.

In various embodiments of the present invention, the first light source 120 emits longitudinal polarized beams and the second light source 140 emits lateral polarized beams. Furthermore, the polarization filter 220 reflects the lateral polarized beams and transmits the longitudinal polarized beams. Accordingly, the lateral polarized beams emitted from the first light sources 120 after being reflected by the polarization filter 220, are directly incident upon the emitter 300, whereas the travel direction of the longitudinal polarized beams emitted from the second light source 140 is changed toward the polarization filter 220 by the mirror 240. Of course, the polarization filter 220 may be configured to transmit the longitudinal polarized beams. In this case, only the longitudinal polarized beams emitted from the second light source 140 are reflected by the mirror 240 and then incident upon the emitter 330 through the polarization filter 220.

Thus, the polarized beams emitted from the first and second light sources 120 and 140 are incident upon the single emitter 300 through the filter 200 including the polarization filter 220 and the mirror 240. Thus, the size of the optical system is reduced and the degree of freedom in design is achieved.

Meanwhile, the light source unit 100 may further include condensing lens units 160, which focus the polarized beams emitted from the light source unit 100 on a focal point. Further, the emitter 300 may be provided at a position corresponding to a focal point, on which the polarized beams emitted from the second light source 140 are focused after being reflected through the mirror 240.

In various embodiments of the present invention, as the laser diode is applied to the light source unit 100 and the condensing lens units 160 are provided, the polarized beams may be focused on a focal point. Namely, as the size of each polarized beams emitted from the light source unit 100 is determined in accordance with a given design, each condensing lens unit 160 may be provided, taking into consideration the focal point.

For example, as shown in FIG. 3, the emitter 300 is disposed at a position corresponding to a real focal point a, on which the polarized beams emitted from the second light source 140 are focused after being reflected by the mirror 240. In this case, the distance between the mirror 240 and the real focal point a is the same as the distance between the mirror 240 and a virtual focal point b, on which the polarized beams emitted from the second light source 140 are focused after passing through the condensing lens 160. Accordingly, the polarized beams of the second light source 140 may be incident upon the emitter 300. Similarly, the emitter 300 may be configured to be disposed at a position corresponding to a real focal point a, on which the polarized beams emitted from the first light source 120 are focused after being reflected by the polarization filter 220. In this case, the distance between the polarization filter 220 and the real focal point a is the same as the distance between the polarization filter 220 and a virtual focal point b, on which the polarized beams emitted from the first light source 120 are focused after passing through the condensing lens unit 160.

Here, the cross sectional area of each polarized beam may be adjusted in accordance with the position of the emitter 300 based on the real focal point a, on which the polarized beams emitted from the light source unit 100 are focused after passing through the condensing lens 160, and being reflected by the polarization filter 220 or the mirror 240. Namely, as shown in FIG. 3, as the emitter 300 approaches the mirror 240, between the mirror 240 and the real focal point a, the cross sectional area of each polarized beams is increased. As such, the cross sectional area of each polarized beam may be determined depending on the lighting design for the vehicle.

In various embodiments, light emitted from the emitter 300 may illuminate a front or rear of the vehicle through a reflector 400. Here, the reflector 400 may include a reflecting plate. A lens may be provided instead of the reflector 400. When the polarized beams from the first and second light sources 120 and 140 are emitted through the emitter 300, the reflector 400 may guide the emitted light toward the front or rear of the vehicle. Alternatively, the emitted light may be guided by the lens to illuminate the front or rear of the vehicle. That is, the reflector 400 or the lens is applied to illuminate a point where visibility for the driver should be secured.

In various embodiments, as shown in FIG. 1, a housing 10 having an inner space is further provided. A supporter 12, where the light source unit 100 is installed, is disposed at one side of the inner space. Further, the filter 200 is installed at the other side of the inner space while being disposed in line with and spaced apart from the light source unit 100. The emitter 300 is provided at an upper end of the housing 10 and above the filter 200.

That is, as the supporter 12 is provided at the one side of the inner space of the housing 10, the first and second light sources 120 and 140 may be installed at upper and lower portions of the supporter 12, respectively. In addition, the filter 200 is disposed in line with and spaced apart from the light source unit 100 toward the other side of the inner space. Thus, the polarized beams emitted by the light source unit 100 are incident upon the filter 200. After the polarized beams emitted from the light source unit 100 are reflected by the filter 200, the reflected polarized beams are incident upon the emitter 300 to emit the light. Furthermore, the emitted light may be incident upon the reflector 400 to illuminate an outside as the lighting apparatus for the vehicle.

As is apparent from the above description, according to a lighting apparatus for a vehicle of the various embodiments, polarized beams emitted from a plurality of light sources are incident upon the single emitter, thereby reducing a size of an optical system and increasing the degree of the freedom in design. In addition, the size of layout is reduced, thereby decreasing manufacturing costs and weight of the vehicle.

For convenience in explanation and accurate definition in the appended claims, the term's "upper" or "lower", "inner" or "outer" and etc. are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A lighting apparatus for a vehicle comprising:
    a light source unit comprising at least two light sources emitting polarized beams;
    a filter configured to receive the emitted polarized beams, reflect a first beam of the polarized beams, and transmit a second beam of the polarized beams; and
    an emitter configured to receive the polarized beams from the filter, and emit the received polarized beams as light of a predetermined color,
    wherein
        the at least two light sources comprise a first light source and a second light source;
        the first light source is configured to emit at least one of a longitudinal and a lateral polarized beam; and
        the second light source is configured to emit at least one of a lateral and a longitudinal polarized beam having a polarization direction different from a polarization direction of the polarized beam emitted by the first light source,
    wherein the first light source is configured to emit the lateral polarized beam, and the second light source is configured to emit the longitudinal polarized beam, and
    wherein
        the first and second light sources are disposed to have an angle difference of 90° between each other; and
        the polarized beams of the first and second light sources have a phase difference of 90°.

2. The lighting apparatus according to claim 1, wherein the filter is spaced apart a predetermined distance from the light source unit; and
    the filter comprises:
        a polarization filter to reflect the lateral polarized beam and transmit the longitudinal polarized beam; and
        a mirror to reflect the longitudinal polarized beam toward the polarization filter.

3. The lighting apparatus according to claim 2, wherein, in the filter, the polarization filter receiving the polarized beam of the first light source is disposed over the reflecting mirror receiving the polarized beam of the second light source, and the emitter is disposed over the polarization filter, so the polarized beams of the first and second light sources are incident upon the emitter through the polarization filter and the reflecting mirror.

4. The lighting apparatus according to claim 2, wherein the light source unit further comprises a condensing lens unit disposed in front of the light source unit for focusing the polarized beams emitted from the light source unit on a focal point; and
    the emitter is disposed at a position corresponding to the focal point, on which the polarized beam emitted from the second light source is focused after being reflected through the reflecting mirror.

5. The lighting apparatus according to claim 1, wherein the beams emitted by the emitter illuminate front and rear of the vehicle through at least one of a reflector and a lens.

6. The lighting apparatus according to claim 1, further comprising a housing having an inner space, wherein
    the light source unit is disposed at a supporter which is disposed at a first side of the inner space;
    the filter is disposed at a second side opposite to the first side and is disposed in line with and spaced apart from the light source unit; and
    the emitter is positioned at an upper end of the housing and disposed over the filter.

* * * * *